(12) United States Patent
Itatani et al.

(10) Patent No.: US 10,340,237 B2
(45) Date of Patent: Jul. 2, 2019

(54) METHOD OF MANUFACTURING SEMICONDUCTOR DEVICE

(71) Applicant: HITACHI KOKUSAI ELECTRIC INC., Tokyo (JP)

(72) Inventors: Hideharu Itatani, Toyama (JP); Naofumi Ohashi, Toyama (JP); Toshiyuki Kikuchi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/881,249

(22) Filed: Jan. 26, 2018

(65) Prior Publication Data

US 2019/0081014 A1 Mar. 14, 2019

(30) Foreign Application Priority Data

Sep. 11, 2017 (JP) .................... 2017-174089

(51) Int. Cl.
| | | |
|---|---|---|
| *C23C 14/34* | (2006.01) | |
| H01L 23/00 | (2006.01) | |
| *C23C 16/455* | (2006.01) | |
| *C23C 16/511* | (2006.01) | |

(52) U.S. Cl.
CPC .............. H01L 24/03 (2013.01); C23C 14/34 (2013.01); C23C 16/45565 (2013.01); C23C 16/511 (2013.01); *H01L 2224/03019* (2013.01); *H01L 2224/0345* (2013.01); *H01L 2924/07025* (2013.01); *H01L 2924/3641* (2013.01)

(58) Field of Classification Search
CPC ......... H01L 21/02271; H01L 21/76829; H01L 21/022; H01L 21/4857
See application file for complete search history.

(56) References Cited

U.S. PATENT DOCUMENTS

| | | | |
|---|---|---|---|
| 6,121,160 A | 9/2000 | Igarashi et al. | |
| 2002/0043723 A1 | 4/2002 | Shimizu et al. | |
| 2011/0254159 A1 | 10/2011 | Hwang et al. | |
| 2012/0248422 A1* | 10/2012 | Mine ................... | H01L 51/5256 257/40 |
| 2013/0180945 A1* | 7/2013 | Koitz ................ | H01L 21/02063 216/13 |

(Continued)

FOREIGN PATENT DOCUMENTS

| | | |
|---|---|---|
| JP | 07-050323 A | 2/1995 |
| JP | 08-116071 A | 5/1996 |

(Continued)

OTHER PUBLICATIONS

Taiwanese Office Action dated Aug. 20, 2018 for the Taiwanese Patent Application No. 106135419.

*Primary Examiner* — Changhyun Yi
(74) *Attorney, Agent, or Firm* — Volpe and Koenig, P.C.

(57) ABSTRACT

A method of manufacturing a high quality a semiconductor device, includes loading a substrate comprising a conductive film and an insulating film into a process chamber. The insulating film is formed around the conductive film to expose the conductive film. A process gas, which comprises a component that reacts with a desorbed gas generated from the insulating film is supplied into the process chamber which causes a protective film to be selectively formed on the insulating film.

20 Claims, 13 Drawing Sheets

(56) References Cited

U.S. PATENT DOCUMENTS

| | | | |
|---|---|---|---|
| 2014/0256156 A1* | 9/2014 | Harada | H01L 21/67017 |
| | | | 438/778 |
| 2014/0264778 A1* | 9/2014 | Lim | H01L 21/28194 |
| | | | 257/632 |
| 2017/0198395 A1* | 7/2017 | Nozawa | H01L 21/3065 |

FOREIGN PATENT DOCUMENTS

| JP | 2010-147267 A | 7/2010 |
|---|---|---|
| JP | 2010-186916 A | 8/2010 |

\* cited by examiner

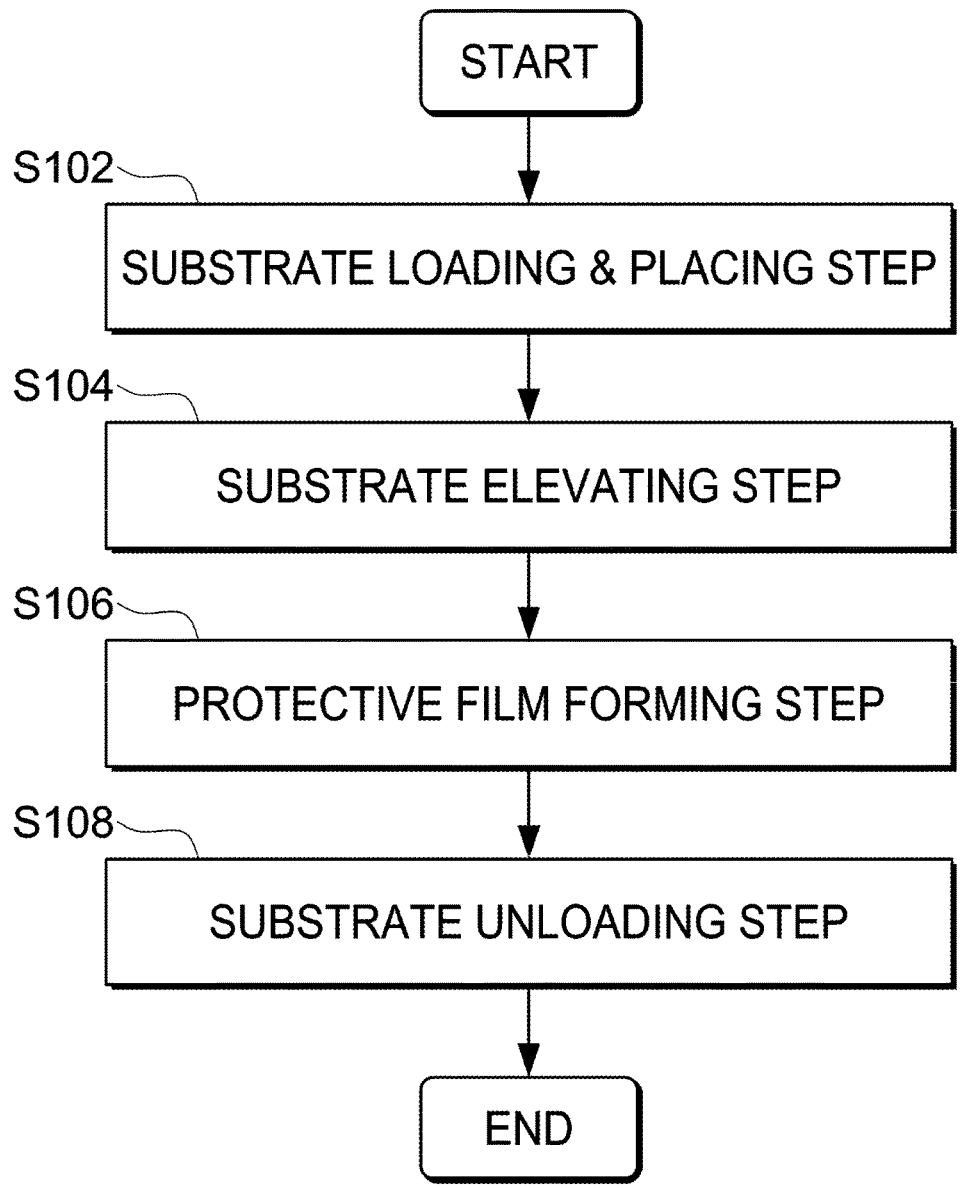

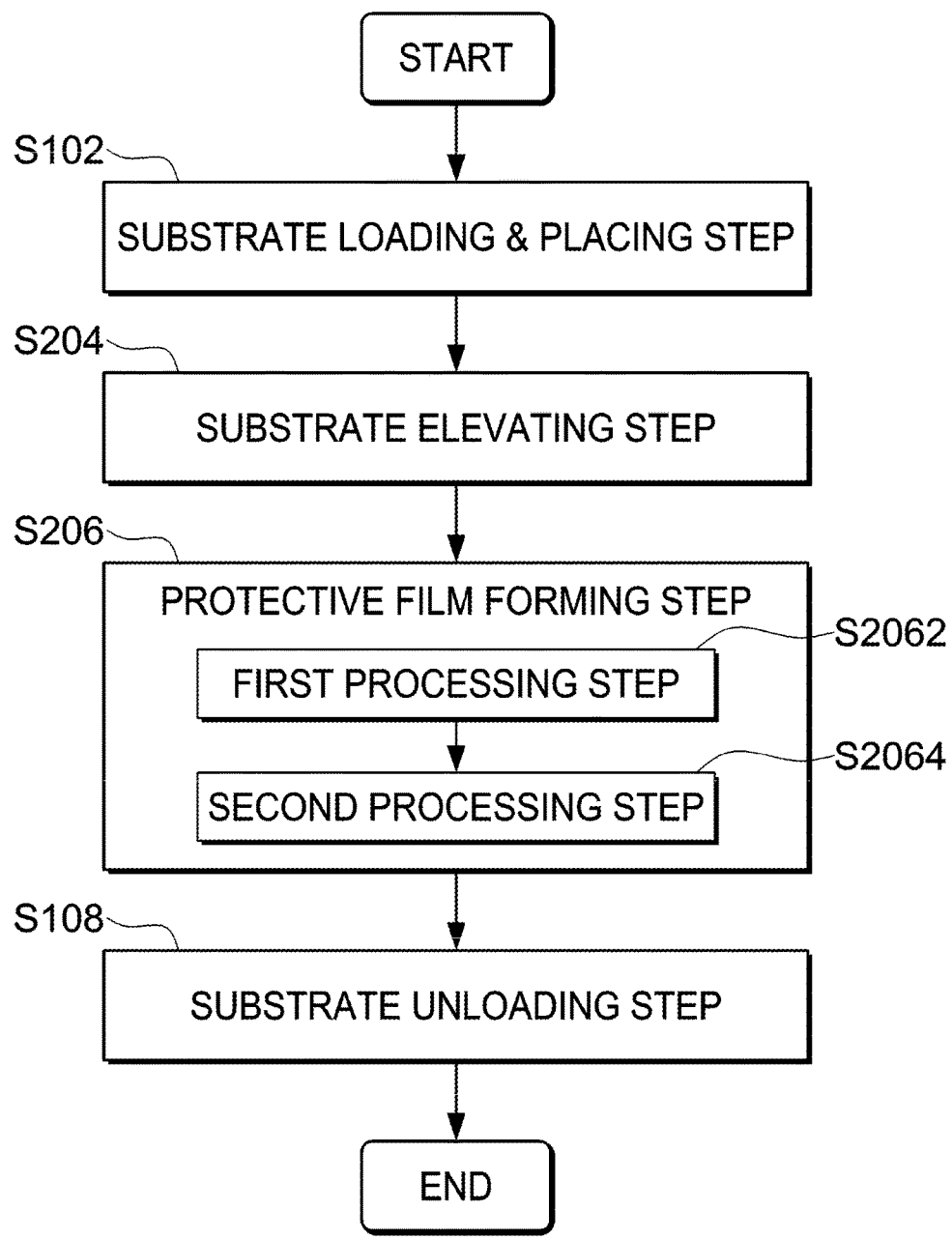

METHOD OF MANUFACTURING SEMICONDUCTOR DEVICE

CROSS-REFERENCE TO RELATED PATENT APPLICATION

This U.S. non-provisional patent application claims priority under 35 U.S.C. § 119 of Japanese Patent Application No. 2017-174089, filed on Sep. 11, 2017, in the Japanese Patent Office, the entire contents of which are hereby incorporated by reference.

BACKGROUND

1. Field

The present disclosure relates to a method of manufacturing a semiconductor device.

2. Description of the Related Art

Recently, semiconductor devices are integrated at high density. As a result, the distance between electrodes or between wirings is reduced. As the distance is reduced, characteristics of the semiconductor device such as the operating speed are affected by the qualities of the electrodes and the wirings. That is, the electrodes and the wirings of high qualities result in high quality semiconductor devices, and the electrodes and the wirings of low qualities result in low quality semiconductor devices.

As a packaging technology, there is a technique of connecting a conductive film such as an electrode pad with a wiring. According to the packaging technology, it is required that the quality of the insulation formed around the wiring and the conductive film is high.

SUMMARY

Described herein is a technique capable of manufacturing a semiconductor device of high quality.

According to one aspect of the technique described herein, there is provided a method of manufacturing a semiconductor device, including: (a) loading a substrate into a process chamber, the substrate comprising a conductive film and an insulating film formed around the conductive film to expose the conductive film; and (b) forming a protective film selectively on the insulating film by supplying into the process chamber a process gas comprising a component reactive with a desorbed gas generated from the insulating film.

BRIEF DESCRIPTION OF THE DRAWINGS

FIG. 8 is flow diagram of a substrate processing according to the first embodiment.

FIG. 9 is flow diagram of a substrate processing according to a second embodiment.

DETAILED DESCRIPTION

<First Embodiment>

A first embodiment will be described below. First, a substrate 100 to be processed having a predetermined structure thereon according to the first embodiment will be described with reference to FIG. 1. A lower wiring layer 101 includes wiring made of a material such as aluminum and copper. The lower wiring layer 101 is formed on the substrate 100. An interlayer insulating layer 102 is formed on the lower wiring layer 101. The interlayer insulating layer 102 includes, for example, a silicon oxide film (hereinafter referred to as "SiO film").

Figure 1:
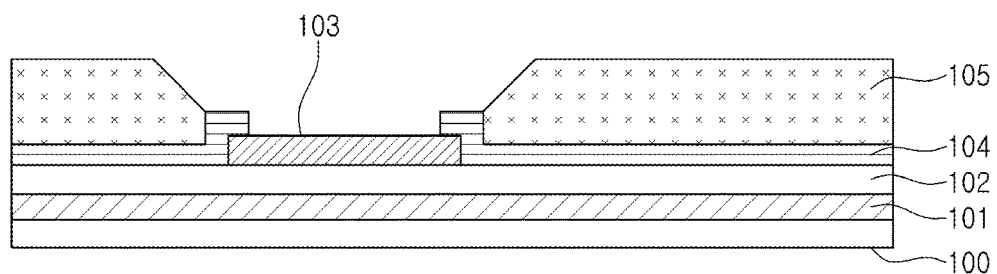
FIG. 1 schematically illustrates a substrate to be processed and a structure formed thereon according to a first embodiment.

A pad 103, which is a conductive film, is formed on the interlayer insulating layer 102, and a protective film 104 is formed around the pad 103. The pad 103 includes, for example, an aluminum-based pad. The protective film 104 is also referred to as a passivation film and includes, for example, a silicon nitride film (hereinafter referred to as "SiN film"). A polyimide film 105, which is an insulating film, is formed on the protective film 104. As shown in FIG. 1, the surfaces of the pad 103 and the insulating film 105 are exposed. The pad 103 has a property which does not generate desorbed gas 106.

Conventionally, a seed film is formed on the pad 103 or the polyimide film 105 by subjecting the substrate 100 to a sputtering process. A metal wiring is then formed on the seed film.

The inventors of the present application have found that the atoms released from the target during the sputtering process for forming the conventional seed film damage the polyimide film 105. As a result, the surface of the polyimide film 105 becomes rough.

Figure 14:
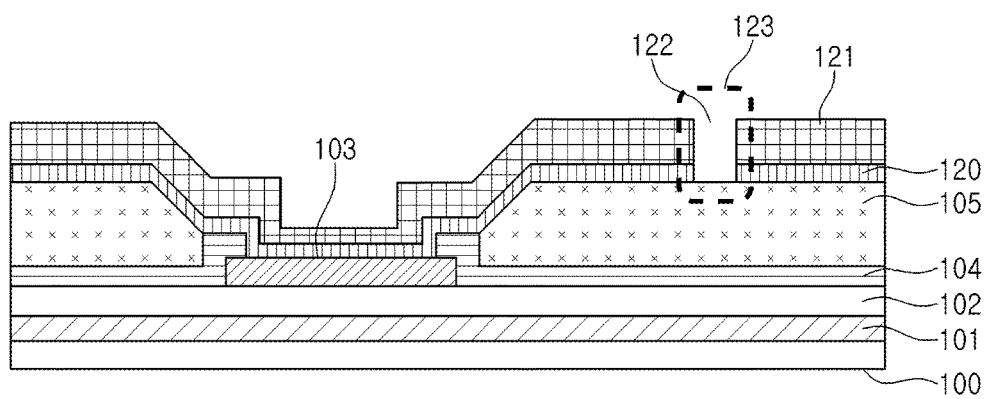
FIG. 14 schematically illustrates a substrate and a structure formed thereon according to a comparative example.
Figure 15:
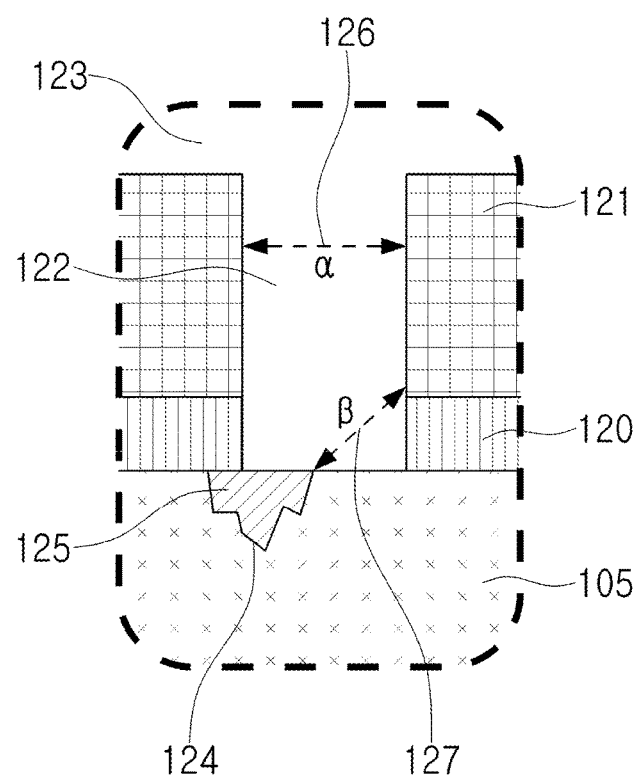
FIG. 15 illustrates a partial enlarged view of the structure shown in FIG. 14.

Hereinafter, the problem of the rough polyimide film 105 will be described by way of comparative example with reference to FIGS. 14 and 15. FIG. 14 illustrates the substrate and the structure formed thereon according to the comparative example, and FIG. 15 illustrates a partial enlarged view of the structure shown in FIG. 14. The polyimide film 105 of the structure shown in FIG. 14 and FIG. 15 is damaged during the sputtering process wherein the polyimide film 105 is etched by atoms released from the target.

The structure shown in FIG. 14 includes the seed film 120, the wirings 121 and a recess 122 between the wirings 121 formed on the polyimide film 105. The recess 122 insulates two adjacent wirings 121. The recess 122 may be filled with an insulating material 125. In case the recess 122 is not filled, the recess 122 may act as an air-gap.

FIG. 15 illustrates a partial enlarged view of a portion 123 of the polyimide film 105 damaged during the sputtering process, which is denoted by dashed line in FIG. 14. Specifically, when the polyimide film 105 is partially etched by the atoms released from the target during the sputtering process, an undesirable recess 124 is formed. When the recess 124 is filled with the material forming the seed film 120 or the wiring 121 during the formation of the seed film 120 or the wiring 121, the metal-containing material 125 is formed.

As described above, since the semiconductor device is integrated at high density and the recess 124 is randomly formed during the sputtering process, the recess 124 may be formed below the wiring 121. As a result, the metal-containing material 125 may come in contact with the seed film 120. When the metal-containing material 125 comes in contact with the seed film 120, the metal-containing material 125 and the seed film 120 are electrically connected. Since the seed film 120 contains metal, the wiring 121 and the metal-containing material 125 are also electrically connected.

In case the polyimide film 105 is not damaged during the sputtering process, the recess 124 and the metal-containing material 125 shown in FIG. 15 are not formed, and the distance between adjacent wirings is maintained at the electrical distance $\alpha$ denoted by an arrow 126 in FIG. 15. By maintaining the distance $\alpha$ between neighboring wirings, electrical insulation can be ensured.

On the other hand, in case the polyimide film 105 is damaged during the sputtering process as shown in FIG. 15, the metal-containing material 125 is formed. Since the metal-containing material 125 and the seed film 120 are electrically connected, the electrical distance between adjacent wirings is distance $\beta$ denoted by an arrow 127 between the metal-containing material 125 and the wiring 121.

In order to ensure the electrical insulation between the wiring 121 and the metal-containing material 125, a certain distance must exist between the wirings 121. However, since the recess 124 is randomly formed and the spacing between the wirings is narrower due to a high density, the distance between adjacent wirings (e.g., the distance $\beta$ between the metal-containing material 125 and the wiring 121 denoted by the arrow 127 in FIG. 15) is shorter than the distance $\alpha$.

Since the recess 124 is randomly formed, it is difficult to design a device considering in advance the distance $\beta$ denoted by the arrow 127. Even when the distance $\beta$ can be considered to obtain sufficient insulation when designing the device, the size of the device would increase as the distance between the wirings 121 is increased.

Figure 3:
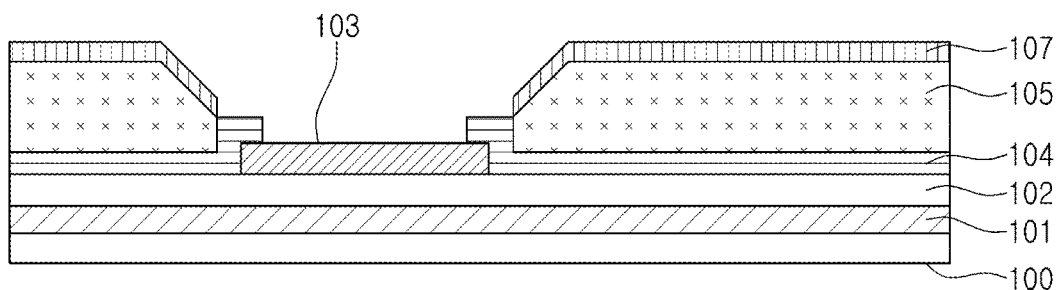
FIG. 3 illustrates a protective film formed on the structure shown in FIG. 1 according to the first embodiment.
Figure 4:
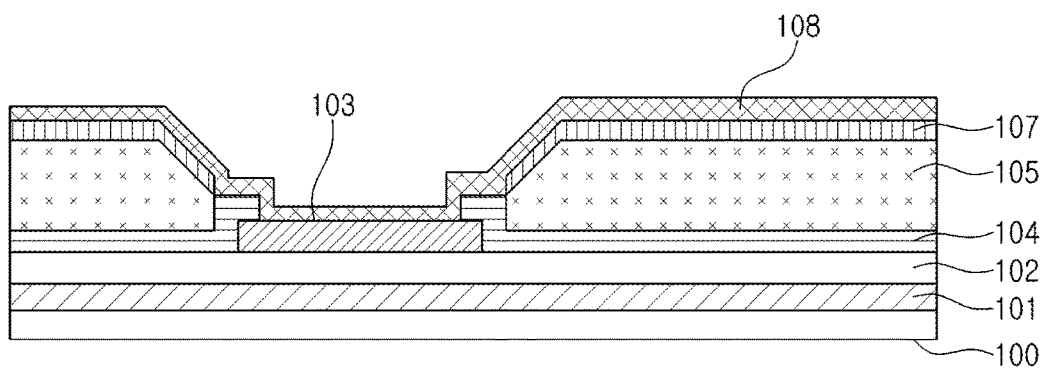
FIG. 4 illustrates a seed film formed on the protective film shown in FIG. 3 according to the first embodiment.

According to the first embodiment, a protective film 107 is formed on the polyimide film 105 in order to prevent the surface of the polyimide film 105 from becoming rough during the sputtering process as shown in FIGS. 3 and 4. Hereinafter, a method of forming the protective film, which is one of the processes of a semiconductor manufacturing method, will be described in detail.

Figure 2:
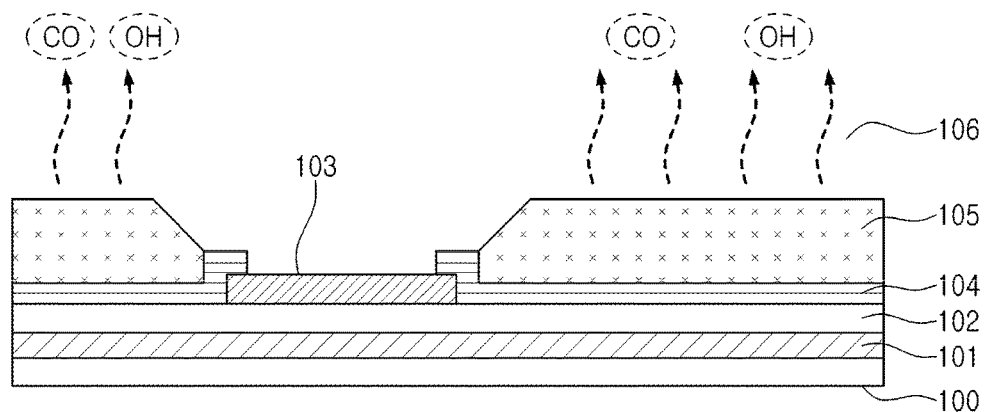
FIG. 2 schematically illustrates generation of desorbed gases from the substrate and the structure shown in FIG. 1.

The properties of the polyimide film 105 will be described with reference to FIG. 2. Generally, the polyimide film 105 generates the desorbed gas 106 at a predetermined temperature (for example, 80° C.). The desorbed gas 106 may include CO and OH.

Next, as shown in FIG. 3, the protective film 107 is formed on the polyimide film 105. As shown in FIG. 4, a seed film 108 is formed on the protective film 107 and the pad 103 after the protective film 107 is formed. The seed film 108 is formed by a sputtering process.

When the seed film 108 is formed by the sputtering process, the protective film 107 protects the polyimide film 105 from atoms (or molecules) released from the target. As shown in FIG. 4, the seed film 108 is formed with the polyimide film 105 of the substrate 100 protected from the atoms released from the target.

Figure 5:
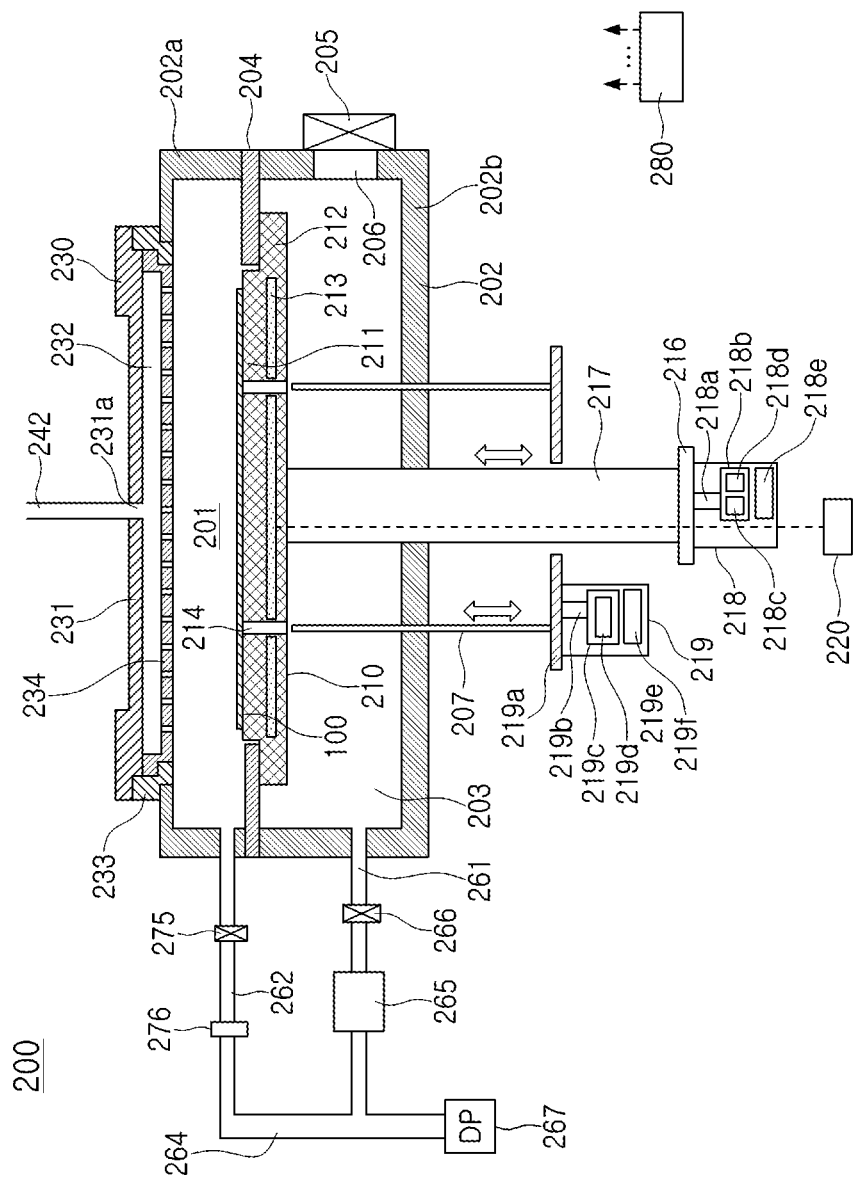
FIG. 5 schematically illustrates a substrate processing apparatus preferably used in the first embodiment.
Figure 6:
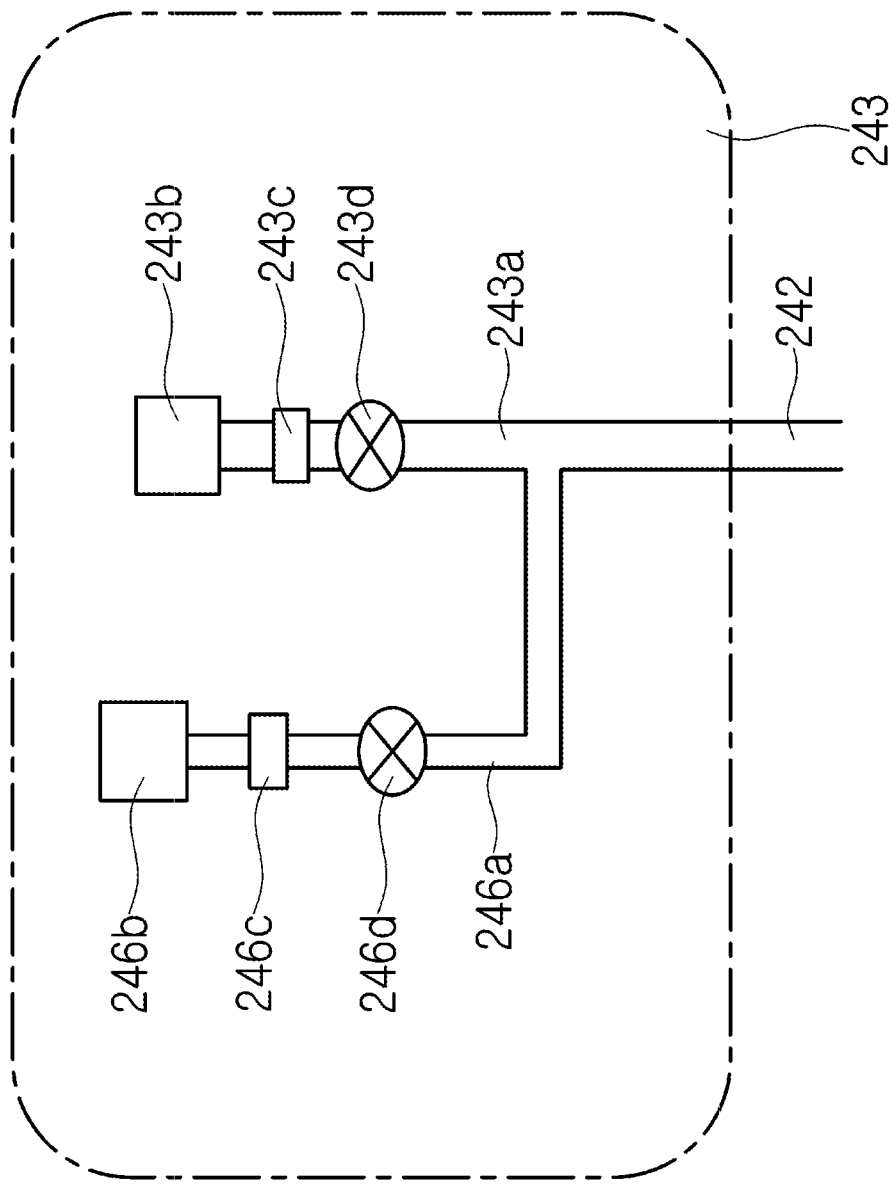
FIG. 6 schematically illustrates a gas supply system of the substrate processing apparatus preferably used in the first embodiment.
Figure 7:
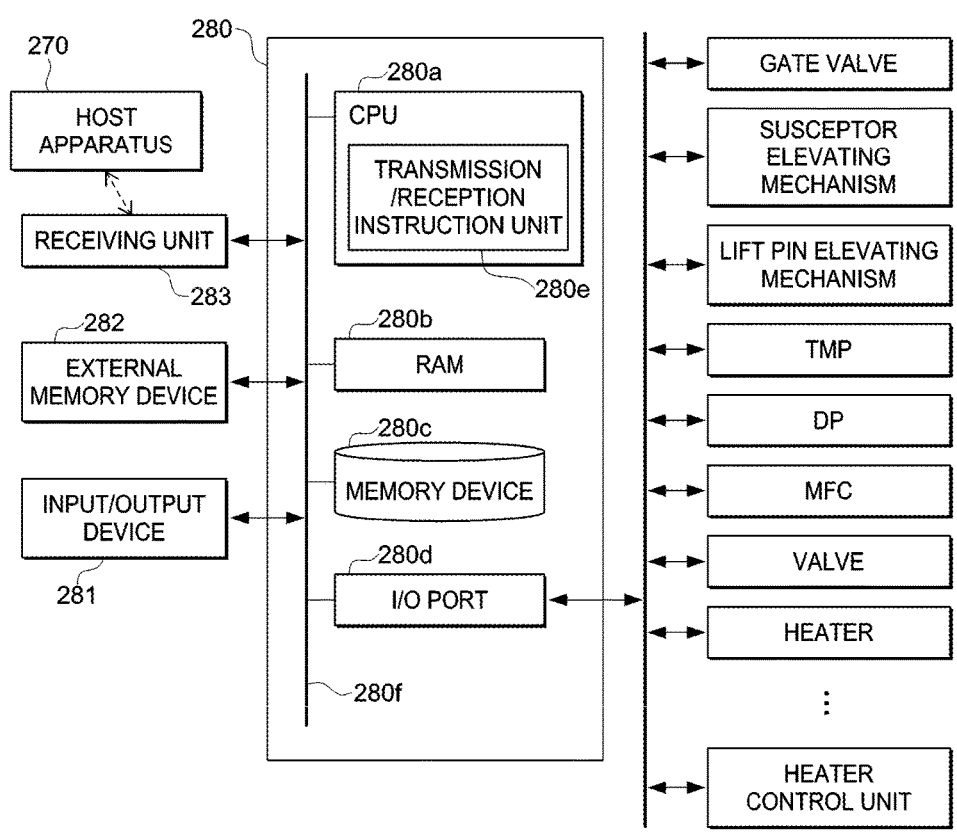
FIG. 7 is a block diagram illustrating a controller of the substrate processing apparatus preferably used in the first embodiment.

Next, a substrate processing apparatus 200 used for forming the protective film 107 and a method of forming the protective film 107 will be described. FIGS. 5 through 7 illustrate substrate processing apparatus which is preferably used in the first embodiment, and FIG. 8 is flow diagram of a substrate processing for forming the protective film 107 according to the first embodiment.

<Substrate Processing Apparatus>

As shown in FIG. 5, a process vessel 202 of the substrate processing apparatus 200 is a flat and sealed vessel having a circular horizontal cross-section. The process vessel 202 is made of a metal material such as aluminum (Al) and stainless steel (SUS). A processing space 201 in which the substrate 100 such as a silicon wafer is processed, and a transfer space 203 through which the substrate 100 is transferred to the processing space 201 are provided in the process vessel 202. The process vessel 202 includes an upper vessel 202a and a lower vessel 202b. A partition plate 204 is provided between the upper vessel 202a and the lower vessel 202b.

The processing space 201 is also referred to as a process chamber. Referring to FIG. 5, the process chamber accommodates, for example, a substrate support 210, a dispersion plate 234, and the upper vessel 202a. The process chamber is not limited to accommodating the substrate support 210, the dispersion plate 234 and the upper vessel 202a. The process chamber may further accommodate any component necessary for processing the substrate 100 in the processing space 201.

A substrate loading/unloading port 206 is provided on a side surface of the lower vessel 202b adjacent to the gate valve 205. The substrate 100 is moved between a vacuum transfer chamber (not shown) and the transfer space 203 through the substrate loading/unloading port 206. Holes through which lift pins 207 penetrate are provided at the bottom of the lower vessel 202b.

The substrate support unit 210 is provided in the processing space 201 to support the substrate 100. The substrate support unit 210 includes a substrate support 212 having a substrate placing surface 211 on which the substrate 100 is placed and a heater 213 serving as a heating source provided in the substrate support 212. Holes 214 through which the lift pins 207 penetrate are provided in the substrate support 212 at positions corresponding to the lift pins 207. A heater control unit 220 is connected to the heater 213. The heater control unit 220 is configured to control the energization state of the heater 213. The substrate support 212 may also be referred to as a susceptor.

The lift pins 207 are supported by a lift pin elevating mechanism 219. The lift pins 207 penetrate the bottom of the process vessel 202 and are coupled to the lift pin elevating mechanism 219 outside of the process vessel 202.

The lift pin elevating mechanism 219 may include a support plate 219a supporting the lift pins 207, a support shaft 219b supporting the support plate 219a and an actuation unit 219c configured to move the support shaft 219b up and down or to rotate the support shaft 219b. The lift pins 207 are supported by the support plate 219a. The actuation unit 219c may include an elevating mechanism 219d such as a motor to move the support shaft 219b up and down.

Figure 10A:
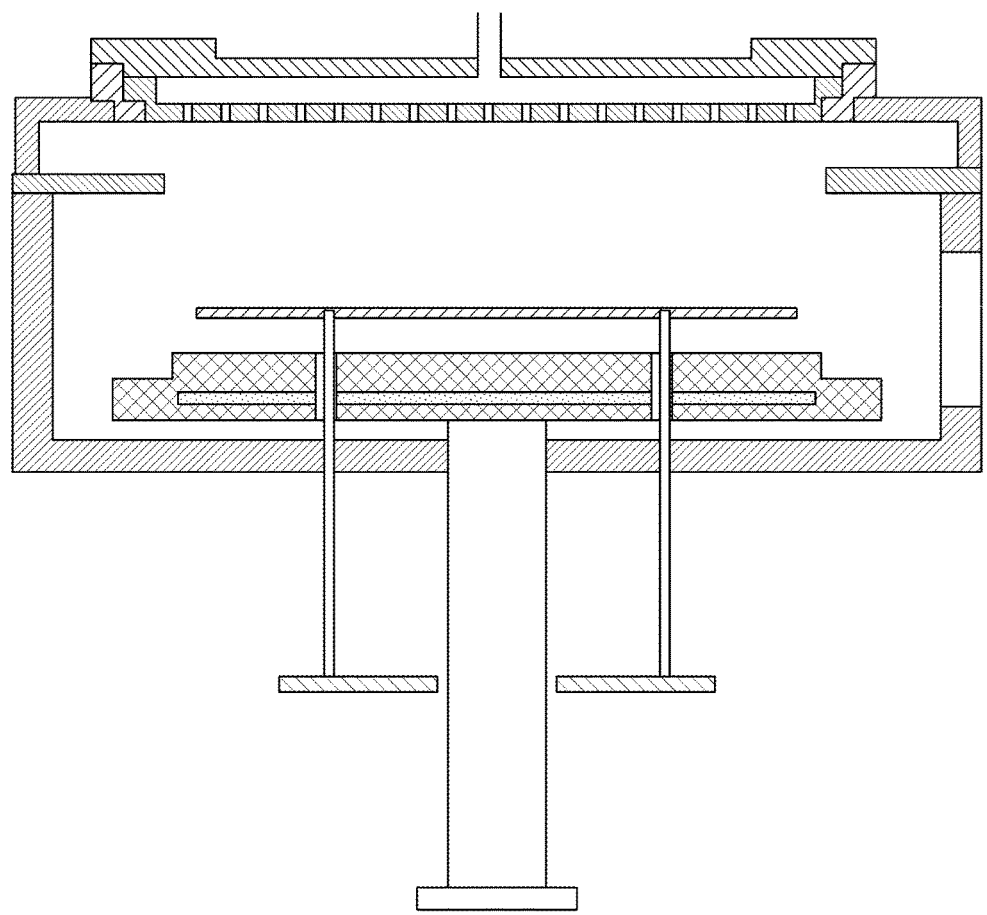
FIG. 10A through FIG. 10C schematically illustrate operations of the substrate processing apparatus according to the second embodiment.
Figure 10B:
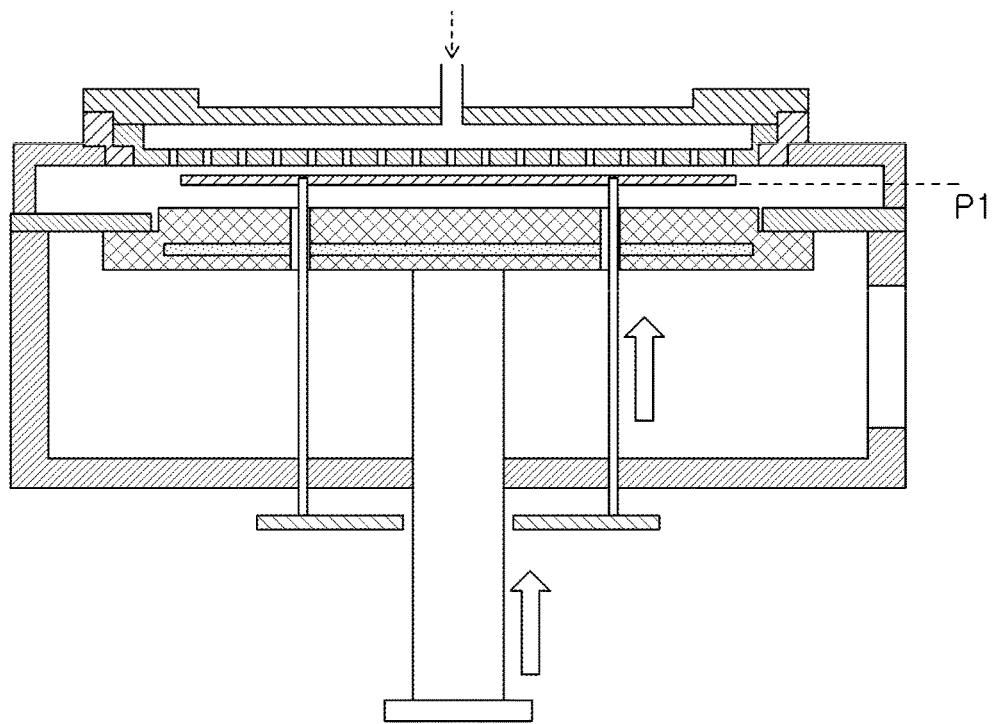
Figure 10C:
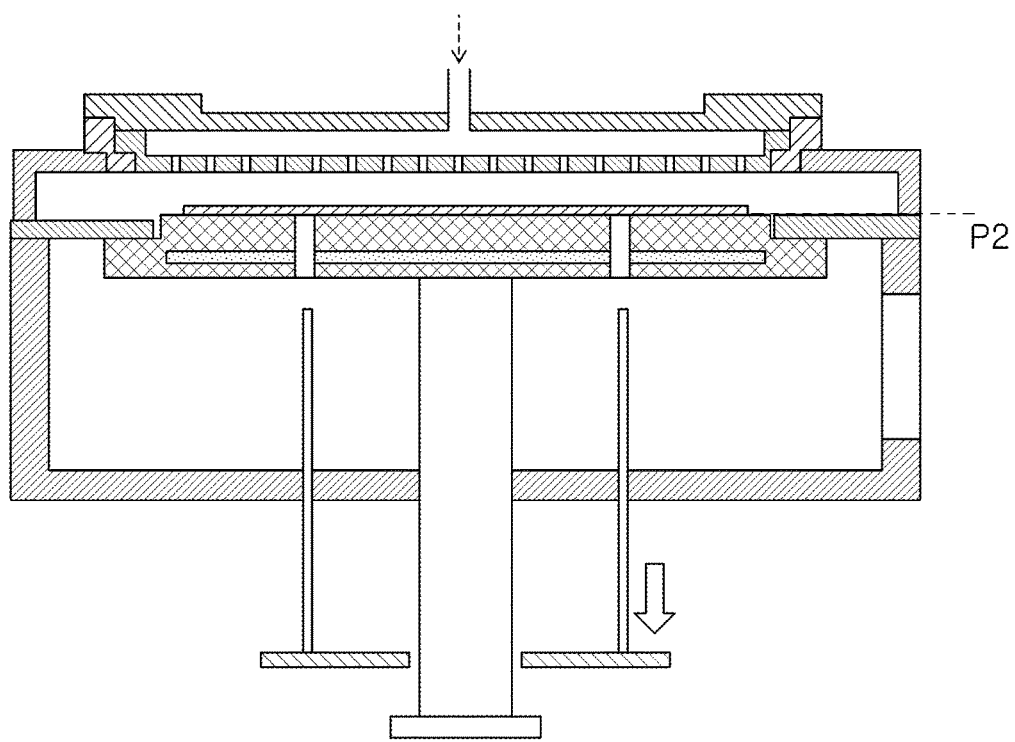

The lift pin elevating mechanism 219 may further include an instruction unit 219f configured to control the actuation unit 219c, which is a part of the lift pin elevating mechanism 219, to move the support shaft 219b up and down. The instruction unit 219f is electrically connected to a controller 280 which is described later. The actuation unit 219c may be controlled by the instruction unit 219f based on an instruction from the controller 280. As shown in FIG. 10A through FIG. 10C, the actuation unit 219c is configured to control the lift pins 207 such that the substrate 100 is moved between a first substrate processing position P1 and a second substrate processing position P2.

The substrate support 212 is supported by a shaft 217. The shaft 217 penetrates the bottom of the process vessel 202 and is connected to a susceptor elevating mechanism 218 outside of the process vessel 202 through a support plate 216.

The susceptor elevating mechanism 218 may include a support shaft 218a supporting the shaft 217 and an actuation unit 218b configured to move the support shaft 218a up and down or to rotate the support shaft 218a. The actuation unit 218b may include an elevating mechanism 218c such as a motor to move the support shaft 218a up and down and a rotating mechanism 218d such as gears to rotate the support shaft support shaft 218a. Lubricating material such as grease is applied on the motor and the gears to smoothen the operation of the same.

The susceptor elevating mechanism 218 may further include an instruction unit 218e configured to control the actuation unit 218b, which is a part of the susceptor elevating mechanism 218, to move the support shaft 218a up and down and to rotate the support shaft 218a. The instruction unit 218e is electrically connected to the controller 280. The instruction unit 218e is configured to control the actuation unit 218b based on an instruction from the controller 280. As described later, the actuation unit 218b is configured to control the substrate support 212 such that the substrate support 212 is moved between a wafer transfer position and the second substrate processing position P2.

The substrate 100 placed on the substrate placing surface 211 is lifted and lowered by operating the susceptor elevating mechanism 218 to lift and lower the shaft 217 and the substrate support 212.

According to the first embodiment, the lift pin elevating mechanism 219 and the susceptor elevating mechanism 218 are two separate components. However, as long as the lift pins 207 and the substrate support 212 may be adjusted to be at different heights, the lift pin elevating mechanism 219 and the susceptor elevating mechanism 218 may be implemented as a single component. The lift pin elevating mechanism 219 and the susceptor elevating mechanism 218 are collectively referred to as "elevating mechanism".

A shower head 230, which is a gas dispersion mechanism, is provided at an upstream side of the processing space 201. A gas introduction port 231a is provided on a cover 231 of the shower head 230. A common gas supply pipe 242 is spatially connected to the cover 231 of the shower head 230 to communicate with a buffer space 232 provided in the shower head 230 through the gas introduction port 231a. The gases supplied through a gas supply system, which will be described later, are supplied to the shower head 230 through the common gas supply pipe 242.

The shower head 230 includes a dispersion plate (dispersion mechanism) 234 for dispersing gas. A space at the upstream side of the dispersion plate 234 is referred to as the buffer space 232 and a space at the downstream side of the dispersion plate 234 is referred to as the processing space 201. The dispersion plate 234 is arranged to face the substrate placing surface 211.

The upper vessel 202a includes a flange (not shown). A support block 233 is placed on and fixed to the flange (not shown). The support block 233 includes a flange (not shown). The dispersion plate 234 is placed on and fixed to the flange of the support block 233.

<Gas Supply System>

Next, the gas supply system will be described in detail with reference to FIG. 6. A first gas supply pipe 243a is connected to the common gas supply pipe 242. A first gas source 243b, a mass flow controller (MFC) 243c serving as a flow rate controller (flow rate control unit) and a valve 243d serving as an opening/closing valve are installed in order from the upstream side to the downstream side of the first gas supply pipe 243a.

A gas containing a first element (hereinafter referred to as first element-containing gas) from the first gas source 243b is supplied to the shower head 230 via the MFC 243c and the valve 243d provided in the first gas supply pipe 243a and the common gas supply pipe 242.

The first element-containing gas is one of process gases and is reactive with the desorbed gas 106. For example, the first element-containing gas is characterized in that the first element-containing gas hydrolytic with the desorbed gas 106. A halogen compound is an example of a compound that is hydrolytic with desorbed gas 106. The first element-containing gas contains a first component that forms a protective film and a second component that generates a gas. The first element, which is the first component, includes, for example, silicon (Si). That is, the first element-containing gas includes, for example, a silicon-containing gas. Specifically, a gas such as dichlorosilane ($SiH_2Cl_2$), hexachlorodisilane (abbreviated as HCD) and trichlorosilane ($SiHCl_3$) may be used as the silicon-containing gas. The second component includes, for example, halogen. Specifically, the second component includes may include fluorine (F) and chlorine (Cl).

An inert gas supply pipe 246a joins the first gas supply pipe 243a at the downstream side of the valve 243d of the first gas supply pipe 243a. An inert gas source 246b, a mass flow controller (MFC) 246b and a valve 246d are installed at the inert gas supply pipe 246a in order from an upstream side to a downstream side of the inert gas supply pipe 246a. An inert gas may be used as a carrier gas or a diluting gas.

The inert gas may include, for example, nitrogen ($N_2$) gas. Instead of $N_2$ gas, rare gases such as helium (He) gas, neon (Ne) gas and argon (Ar) gas may be used as the inert gas.

The gas supply system 243 is constituted by the first gas supply pipe 243a, the MFC 243c and the valve 243d. The gas supply system 243 may also be referred to as a gas supply unit.

An inert gas supply system may include the inert gas supply pipe 246a, the MFC 246c and the valve 246d. The inert gas supply unit may further include the inert gas source 246b and the first gas supply pipe 243a.

The gas supply system 243 may further include the inert gas supply system and the first gas source 243b.

<Exhaust System>

An exhaust system for exhausting an inner atmosphere of the process vessel 202 includes a plurality of exhaust pipes connected to the process vessel 202. That is, the exhaust system includes an exhaust pipe 261 connected to the transfer space 203 and an exhaust pipe 262 connected to the processing space 201. An exhaust pipe 264 is connected to the downstream side of the exhaust pipes 261 and 262.

The exhaust pipe 261 is connected to the side portion of the transfer space 203. A TMP (Turbo Molecular Pump) 265 and a valve 266 are provided in the exhaust pipe 261. The atmosphere of the transfer space 203 is controlled by the co-operation of the TMP 265 and the valve 266.

The exhaust pipe 262 is connected to the side portion of the processing space 201. An APC (Automatic Pressure Controller) 276, which is a pressure controller, is provided in the exhaust pipe 262 to adjust the inner pressure of the processing space 201 to a predetermined pressure. The APC 276 is configured to adjust the conductance of the exhaust pipe 262 in response to an instruction from the controller 280 which is described later. A valve 275 is provided at exhaust pipe 262 at the upstream side of APC 276. The exhaust pipe 262, the valve 275 and the APC 266 are collectively referred to as a processing space exhaust system.

A DP (Dry Pump) 267 is installed in the exhaust pipe 264. As shown in FIG. 5, the exhaust pipe 262 and the exhaust pipe 261 are connected to the exhaust pipe 264 in order from the upstream side to the downstream side of the exhaust pipe 264. The DP 267 is provided at the exhaust pipe 264 at the downstream side of the portion where the exhaust pipe 262 and the exhaust pipe 261 are connected. The DP 267 may be configured to exhaust the inner atmospheres of the processing space 201 and the transfer space 203 through the exhaust pipe 262 and the exhaust pipe 261, respectively.

Next, the controller 280 of the substrate processing apparatus 200 will be described the with reference to FIG. 7. The substrate processing apparatus 200 includes the controller 280 configured to control components thereof.

FIG. 7 schematically illustrates the configuration of the controller 280. The controller (control unit) 280, may be embodied by a computer having a CPU (Central Processing Unit) 280a, a RAM (Random Access Memory) 280b, a memory device 280c and an I/O port 280d. The RAM 280b, the memory device 280c and the I/O port 280d may exchange data with the CPU 280a via an internal bus 280f. The transmission and the reception of data in the substrate processing apparatus 200 is performed according an instruction of a transmission/reception instruction unit 280e, which is a part of the CPU 280a.

An input/output device 281 such as a touch panel and an external memory device 282 may be connected to the controller 280. Also, a receiving unit 283, which is electrically connected to a host apparatus 270 through a network, is provided.

The memory device 280c may be embodied by components such as flash memory and HDD (Hard Disk Drive). A control program for controlling the operation of the substrate processing apparatus and a process recipe in which information such as the order and condition of the substrate processing is stored are readably stored in the memory device 280c. The process recipe is a program that is executed in the controller 280 to obtain a predetermined result by performing sequences of the substrate processing. Hereinafter, the process recipe and the control program are collectively referred to simply as a program. The term "program" may refer to only the process recipe, only the control program, or both. The RAM 280b is a work area in which the program or the data read by the CPU 280a are temporarily stored.

The I/O port 280d is connected to the components of the substrate processing apparatus 200 such as the susceptor elevating mechanism 218, the lift pin elevating mechanism 219 and the heater 213.

The CPU 280a is configured to read and execute the control program stored in the memory device 280c, and read the process recipe in accordance with an instruction such as an operation command inputted from the input/output device 281. The CPU 280a may be configured to perform operations according to the process recipe such as opening and closing operations of the gate valve 205, the elevating operations of the susceptor elevating mechanism 218 and the lift pin elevating mechanism 219, the ON/OFF operations of the pumps, the flow rate adjusting operations of the mass flow controllers (MFCs) and the operation of the valves. A plurality of recipes for processing substrates is stored in the memory device 280c. The CPU 280a is configured to read recipe from the memory device 280c when an instruction to process each substrate is received from the host apparatus 270 via the receiving unit 283.

The controller 280 according to the first embodiment may be embodied by installing the above-described program on a computer using the external memory device 282 storing the above-described program. The external memory device 282 may be embodied by a magnetic disk such as a hard disk, an optical disk such as a DVD, a magneto-optical disk such as MO and a semiconductor memory such as a USB memory. The method of providing the program to the computer is not limited to the external memory device 282. The program may be directly provided to the computer without using the external memory device 282 by a communication means such as the Internet and a dedicated line. The memory device 280c and the external memory device 282 are embodied by a computer-readable recording medium. Hereinafter, the memory device 280c and the external memory device 282 may be collectively referred to simply as a recording medium. In the first embodiment, the term "recording medium" may refer to only the memory device 280c, only the external memory device 282, or both.

<Substrate Processing Method>

Next, the substrate processing method for forming the protective film 107 on the substrate 100 loaded into the substrate processing apparatus 200 will be described in detail with reference to FIG. 8. The substrate 100 placed on the substrate placing surface 211 in the substrate processing apparatus 200 is as shown in FIG. 1.

Hereinafter, an example wherein the protective film 107 is formed using HCD gas (silicon-containing gas) as a first processing gas will be described.

<Substrate Loading & Placing Step S102>

A substrate loading and placing step S102 will be described. The substrate support 212 of the substrate processing apparatus 200 is lowered to the transfer position of the substrate 100. Next, the gate valve 209 is opened. The transfer space 203 communicates with the vacuum transfer chamber (not shown). The substrate 100 is loaded into the transfer space 203 from the vacuum transfer chamber and placed on the lift pins 207 by a substrate transfer device (not shown).

<Substrate Elevating Step S104>

A substrate elevating step S104 will be described. After the substrate 100 is loaded into the process vessel 202, the substrate transfer device is retracted out of the processing vessel 202 and the gate valve 205 is closed to seal the process vessel 202. The substrate support 212 is then elevated until the substrate 100 reaches the substrate processing position P2. The substrate 100 on the lift pins 207 is transferred onto the substrate support 212 as the substrate support 212 is elevated.

At this time, the heater 213 heats the substrate 100 such that the temperature of a surface of the substrate 100 becomes a predetermined temperature. The temperature of the substrate 100 at the time of placement on the substrate placing surface 211 is equal to or higher than a temperature at which the desorbed gas 106 is produced. For example, the temperature of the substrate 100 is equal to or higher than 80° C. The controller 280 is configured to calculate a control value based on temperature detected by the temperature sensor and control the energization state of the heater 213 via the heater control unit 220 to adjust the temperature of the heater 213.

After the substrate 100 is loaded into the processing space 201, the valve 266 is closed to isolate the transfer space 203 from the TMP 265 and the exhaust of the transfer space 203 by the TMP 265 is stopped. The valve 275 is then opened to spatially connect the processing space 201 to the APC 276. The inner pressure of the processing space 201 is adjusted to a predetermined pressure (for example, a high vacuum of $10^{-5}$ Pa to $10^{-1}$ Pa) by adjusting the conductance of the exhaust pipe 262 by the APC 266 and controlling the exhaust flow rate of the processing space 201 by the DP 267.

<Protective Film Forming Step S106>

Next, a protective film forming step S106 will be described. In the protective film forming step S106, the protective film 107 shown in FIG. 3 is formed. After the substrate 100 is placed on the substrate placing surface 211 and heated to a predetermined temperature, HCD gas, which is a process gas, is supplied into the processing space 201 by the gas supply system. The predetermined temperature is, for example, 80° C. at which the desorbed gas 106 is generated from the polyimide film 105.

The protective film 107 is formed on the polyimide film 105 by the reaction between the HCD gas supplied by the gas supply system and the desorbed gas 106 generated from the polyimide film 105.

The desorbed gas 106, which is reactive with the HCD gas, is not generated from the pad 103. Therefore, the protective film 107 is not formed on the pad 103. The HCD gas supplied to the pad 103 is removed by a process such as a vacuum exhaust process. As a result, electrical conduction between the pad 103 and the seed film 108 formed later is facilitated.

As described above, the protective film 107 may be selectively formed on the polyimide film 105, i.e. only on the polyimide film 105 but not on the on the pad 103.

<Substrate Unloading Step S108>

After the protective film forming step S106 is completed, a substrate unloading step S108 is performed. The substrate 100 is unloaded from the substrate processing apparatus 200 in the order reverse to that of the substrate loading & placing step S102

By forming the protective film 107 as described above, the polyimide film 105 is not deteriorated while forming the seed film 108.

<Second Embodiment>

Hereinafter, a second embodiment will be described with reference to the FIG. 9 through FIG. 12. FIG. 9 schematically illustrates a flow of a substrate processing according to the second embodiment. The second embodiment and the first embodiment are substantially identical except substrate elevating step and protective film forming step. Hereinafter, the substrate elevating step of the second embodiment is denoted by "S204", and the protective film forming step is denoted by "S206". Since other steps of the second embodiment and the substrate processing apparatus used in the second embodiment are substantially the same as those of the first embodiment, detailed descriptions thereof are omitted.

<Substrate Elevating Step S204>

A substrate elevating step S204 will be described. After the substrate 100 is loaded into the process vessel 202 as shown in FIG. 10, the substrate transfer device is retracted out of the processing vessel 202 and the gate valve 205 is closed to seal the process vessel 202. Thereafter, as shown in FIG. 10b, the susceptor elevating mechanism 218 moves the substrate support 212 to the second substrate processing position P2 Simultaneously, the lift pin elevating mechanism 219 elevates the lift pins 207 such that the substrate 100 is elevated to the first substrate processing position P1 which is a predetermined distance away from the substrate placing surface 211. As a result, the substrate 100 and the substrate placing surface 211 at the first substrate processing position P1 are separated by a first distance. At this time, as will be described later, the substrate 100 is heated to a first temperature at which desorbed gas is not produced.

<Protective Film Forming Step S206>

Next, the protective film forming step S206 will be described. The protective film forming step S206 includes a first processing step S2062 and a second processing step S2064. First, the reason for performing the first processing step S2062 and the second processing step S2064 will be described.

When the process gas is supplied while the substrate 100 is heated to a temperature at which the desorbed gas 106 is generated as in the first embodiment, the process gas reacts with the desorbed gas 106 in the processing space 201. As a result, a solid that forms the protective film is produced in the processing space 201, and the solid falls onto the substrate 100. While most of the falling solids land on the polyimide film 105, some of the falling solids land on the pad 103.

Specifically, while the desorbed gas 106 is not produced from the pad 103, the solids are formed above the pad 103 as well as the polyimide film 105 due to the diffusion of the desorbed gas 106.

Since the solids adhered to the pad 103 may interfere with the electrical conduction between the pad 103 and the seed film 108 formed thereafter, it is preferable that the solids are deposited only on the polyimide film 105. The second embodiment is an example of a method of preventing a protective film from adhering to the pad 103.

<First Processing Step S2062>

The first processing step S2062 will be described hereinafter. With the substrate 100 at the first substrate processing position P1, the process gas is supplied into the processing space 201. At this time, the substrate 100 is maintained at the first temperature at which the desorbed gas is not generated. For example, the first temperature is 25° C. (room temperature). The temperature of the substrate 100 is adjusted by controlling the distance between the substrate placing surface 211 and the substrate 100 and the time duration of heating.

Figure 11:
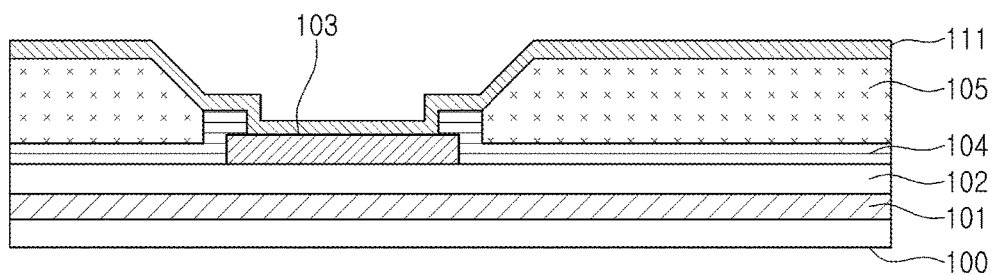
FIG. 11 illustrates a precursor formed on the structure shown in FIG. 1 according to the second embodiment.

According to the second embodiment, the desorbed gas is not present in the processing space 201 unlike the first embodiment since the desorbed gas is not produced at the first temperature. Therefore, the reaction between the process gas and the desorbed gas does not occur above the substrate 100. Instead, the process gas is deposited directly to the substrate 100 without complete solidification to form a precursor 111 as shown in FIG. 11. The precursor 111 is not completely adhered to the substrate 100 and can be easily removed by a vacuum suction process, for example.

When a predetermined time has elapsed, the supply of the process gas is stopped. For example, the supply of the process gas is stopped before the substrate 100 reaches a temperature at which desorbed gas is generated.

<Second Processing Step S2064>

After the first processing step S2062 is performed, the lift pins 207 are lowered until the distance between the substrate placing surface 211 and the substrate 100 is a second distance which is shorter than the first distance. For example, the lift pins 207 may be lowered until the substrate 100 is placed on the substrate placing surface 211 as shown in FIG. 10C. That is, the lift pins 207 may be lowered until the substrate 100 is positioned at the second substrate processing position P2 as shown in FIG. 10C. Alternatively, instead of placing the substrate 100 on the substrate placing surface 211, the substrate 100 may be held above the substrate placing surface 211 such that the substrate 100 is spaced apart from the substrate placing surface 211 by the second distance which is shorter than the first distance. Since the substrate 100 is closer to the heater 213 in the second processing step S2064 than in the first processing step S2062, the temperature of the substrate 100 in the second processing step S2064 is higher than that of the substrate in the first processing step S2062. That is, in the second processing step S2064, the substrate 100 is at a second temperature higher than the first temperature of the first processing step S2062. The second temperature is, for example, the temperature at which the desorbed gas 106 is generated (e.g., 80° C.) from the polyimide film 105.

Figure 12:
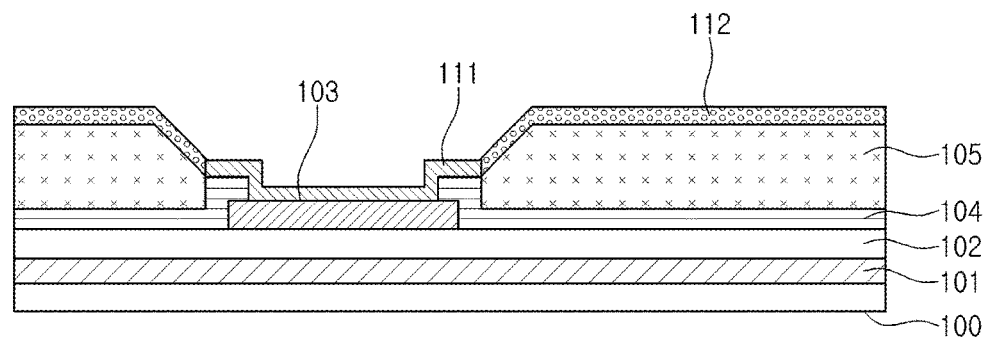
FIG. 12 illustrates a protective film formed on the structure shown in FIG. 1 by modifying the precursor according to the second embodiment.

When the substrate 100 with the precursor 111 thereon is heated by the heater 213, the desorbed gas 106 is generated. The generated desorbed gas 106 reacts with the precursor 111 and the precursor 111 on the polyimide film 105 is modified into a protective film 112 as shown in FIG. 12.

Since the desorbed gas is not generated from the pad 103, the protective film is not formed on the pad 103. The precursor 111 on the pad 103 is removed by a process such as a vacuum suction process which is performed thereafter. Therefore, the precursor 111 does not interfere with the electrical conduction between the pad 103 and the seed film 108 formed thereafter.

As described above, the protective film 112 is not formed on the pad 103 but is selectively formed only on the polyimide film 105.

The pressure in the second processing step S2064 may be increased to be higher than the pressure in the first processing step S2062 by increasing the amount of inert gas supplied in the second processing step S2064. When the pressure in the second processing step S2064 is higher than the pressure in the first processing step S2062 the reaction is promoted to facilitate penetration of the desorbed gas component into the precursor 111. As a result, dense protective film 112 is uniformly formed and the effect of the sputtering process on the polyimide film 105 is reduced.

<Third Embodiment>

Hereinafter, a third embodiment will be described with reference to the FIG. 13.

Figure 13:
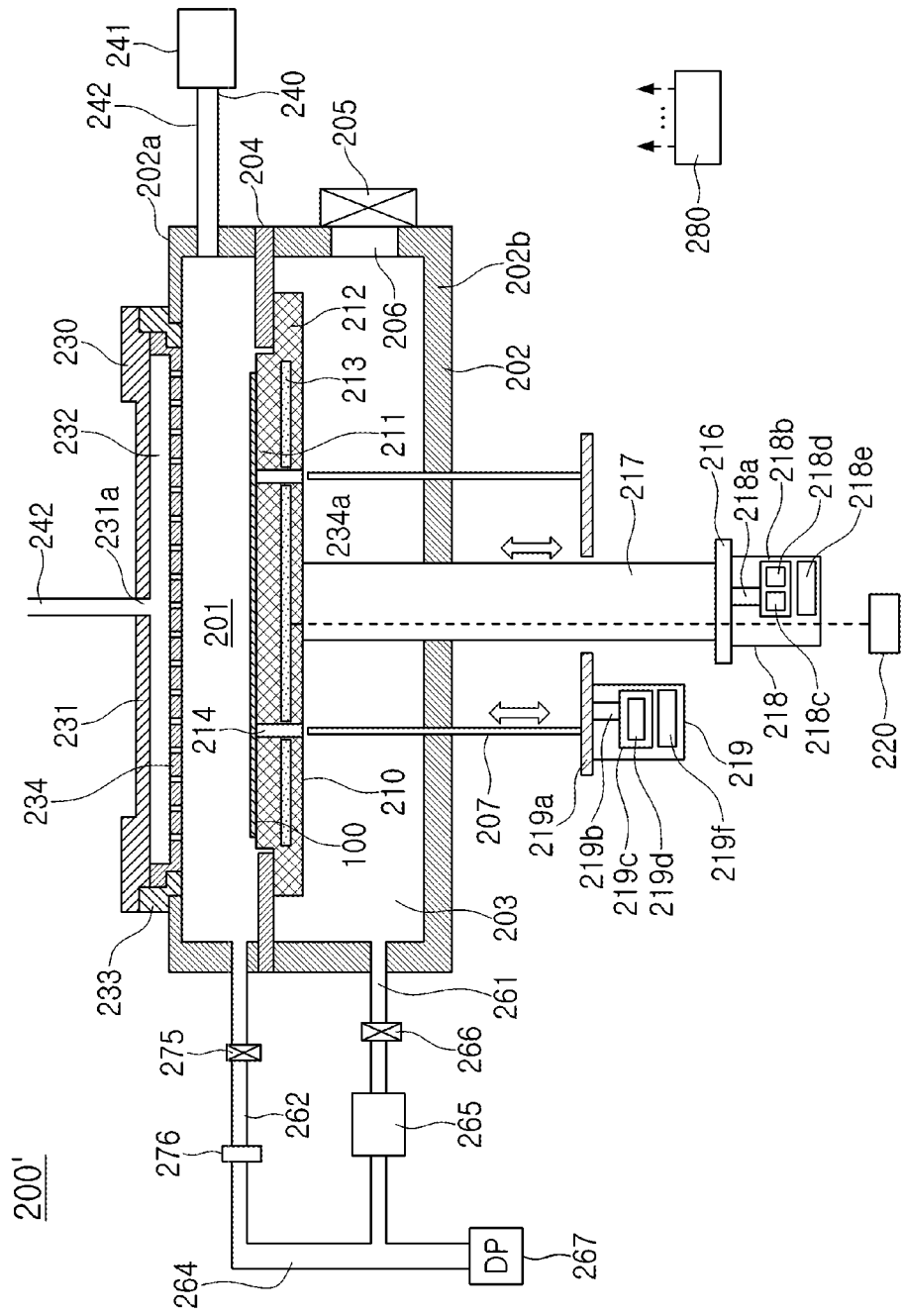
FIG. 13 schematically illustrates a substrate processing apparatus preferably used in a third embodiment.

FIG. 13 schematically illustrates a substrate processing apparatus 200' preferably used in the third embodiment. The substrate processing apparatus 200' shown in FIG. 13 differs from the substrate processing apparatus 200 shown in FIG. 5 in that the substrate processing apparatus 200' further includes a microwave supply unit 240. Since other components of the substrate processing apparatus 200' are the same as those of the substrate processing apparatus 200, the like reference numerals are used for other components and detailed descriptions thereof are omitted.

<Microwave Supply Unit>

Next, the microwave supply unit 240 will be described. The microwave supply unit 240 includes a microwave supply source 241 and a waveguide 242. The upstream side and the downstream side of the waveguide 242 are connected to the microwave supply source 242 and the upper vessel 202a, respectively. The microwave generated by the microwave supply source 241 is irradiated to the substrate 100.

<Protective Film Forming Step S206>

Next, a protective film forming step S206 using the microwave supply unit 240 will be described. In the protective film forming step S206, the protective film 107 shown in FIG. 3 is formed. When the substrate 100 is placed on the substrate placing surface 211, the microwave supply unit 240 irradiates the microwave to the substrate 100.

The microwave irradiated from the microwave supply unit heats the substrate 100 by oscillating molecules in the substrate 100 such that the desorbed gas is generated. When the substrate 100 is heated to and maintained at a predetermined temperature at which the desorbed gas 106 is generated from the polyimide film 105, HCD gas, which is the process gas, is supplied into the processing vessel 202 by the gas supply system. The predetermined temperature is, for example, about 80° C.

The supplied HCD gas reacts with the desorbed gas 106 generated from the polyimide film 105, thereby forming the protective film 107 on the polyimide film 105.

<Other Embodiments>

In the above-described embodiment, HCD gas, which is a chlorine-containing gas, is used. However, the above-described technique is not limited thereto. The above-described technique may also be applied when gases such as acetylene ($C_2H_2$) gas and ethylene ($C_2H_4$) gas are used instead of HCD gas.

While the silicon-containing gas is exemplified as the process gas in the above-described embodiment, the above-described technique is not limited thereto. The above-described technique may also be applied when gases capable of forming sputtering-resistant film such as TMA (trimethyl aluminum) gas for forming AlO film as the protective film is used.

While an electrode pad is exemplified as a conductive film in the above-described embodiment, the above-described technique is not limited thereto. The above-described technique may also be applied to an electrode made of polysilicon or metal.

While the protective film is not formed on the pad 103, the above-described technique is not limited thereto. The above-described technique may be applied even when the protective film is formed on the pad 103 wherein the thickness of the protective film is such that the electrical conduction with the seed film 108 is not interfered.

According to the technique described herein, semiconductor device of high quality may be manufactured.

What is claimed is:

1. A method of manufacturing a semiconductor device, comprising:

(a) loading a substrate into a process chamber, the substrate comprising a conductive film and an insulating film formed around the conductive film to expose the conductive film; and (b) forming a protective film selectively on an upper surface of the insulating film without forming the protective film on the conductive film by supplying into the process chamber a process gas comprising a component reactive with a desorbed gas generated from the insulating film.

2. The method of claim 1, wherein (b) comprises:
(b-1) supplying the process gas into the process chamber while maintaining the substrate at a first temperature to deposit on the substrate a precursor comprising the component; and
(b-2) reacting the precursor with the desorbed gas generated from the insulating film while maintaining the substrate at a second temperature higher than the first temperature after performing (b-1) to form the protective film.

3. The method of claim 2, wherein the process chamber is provided with: a substrate support having a substrate placing surface where the substrate is placed; and an elevating unit configured to adjust a distance between the substrate and the substrate placing surface such that the substrate is spaced apart from the substrate placing surface by a first distance in (b-1) and the substrate is spaced apart from the substrate placing surface by a second distance shorter than the first distance in (b-2).

4. The method of claim 3, wherein the component comprises a halogen.

5. The method of claim 3, wherein the conductive film comprises an electrode and an electrode pad.

6. The method of claim 2, wherein the component comprises a halogen.

7. The method of claim 6, wherein the conductive film comprises an electrode and an electrode pad.

8. The method of claim 6, further comprising: (c) forming a seed film on the protective film by a sputtering process after performing (b).

9. The method of claim 2, wherein the conductive film comprises an electrode and an electrode pad.

10. The method of claim 9, further comprising: (c) forming a seed film on the protective film by a sputtering process after performing (b).

11. The method of claim 2, further comprising: (c) forming a seed film on the protective film by a sputtering process after performing (b).

12. The method of claim 1, wherein the process chamber is provided with a microwave supply unit, and the substrate is heated by microwave supplied by the microwave supply unit.

13. The method of claim 12, wherein the component comprises a halogen.

14. The method of claim 13, wherein the conductive film comprises an electrode and an electrode pad.

15. The method of claim 12, wherein the conductive film comprises an electrode and an electrode pad.

16. The method of claim 1, wherein the component comprises a halogen.

17. The method of claim 16, wherein the conductive film comprises an electrode and an electrode pad.

18. The method of claim 17, further comprising: (c) forming a seed film on the protective film by a sputtering process after performing (b).

19. The method of claim 1, wherein the conductive film comprises an electrode and an electrode pad.

20. The method of claim 19, further comprising: (c) forming a seed film on the protective film by a sputtering process after performing (b).

* * * * *